(12) United States Patent
Luan

(10) Patent No.: US 9,887,201 B2
(45) Date of Patent: Feb. 6, 2018

(54) ONE-TIME PROGRAMMABLE MEMORY AND METHOD FOR MAKING THE SAME

(71) Applicant: Kilopass Technology, Inc., San Jose, CA (US)

(72) Inventor: Harry Shengwen Luan, Saratoga, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/250,831

(22) Filed: Aug. 29, 2016

(65) Prior Publication Data

US 2017/0053927 A1 Feb. 23, 2017

Related U.S. Application Data

(60) Continuation of application No. 14/681,852, filed on Apr. 8, 2015, now Pat. No. 9,431,254, which is a division of application No. 14/250,267, filed on Apr. 10, 2014, now Pat. No. 9,230,813, which is a continuation-in-part of application No. 13/687,925, filed on Nov. 28, 2012, now abandoned, which is a continuation of application No. 12/819,566, filed on Jun. 21, 2010, now Pat. No. 8,330,189.

(51) Int. Cl.
| | |
|---|---|
| *H01L 27/112* | (2006.01) |
| *H01L 21/28* | (2006.01) |
| *G11C 17/16* | (2006.01) |
| *H01L 23/525* | (2006.01) |
| *H01L 29/66* | (2006.01) |

(52) U.S. Cl.
CPC ........ *H01L 27/11206* (2013.01); *G11C 17/16* (2013.01); *H01L 21/28008* (2013.01); *H01L 23/5252* (2013.01); *H01L 29/66477* (2013.01); *H01L 2924/0002* (2013.01)

(58) Field of Classification Search
CPC ........... H01L 21/28079; H01L 23/5252; H01L 27/11206; G11C 17/16
See application file for complete search history.

(56) References Cited

U.S. PATENT DOCUMENTS

| | | | |
|---|---|---|---|
| 5,480,823 | A | 1/1996 | Hsu |
| 6,252,293 | B1 | 6/2001 | Seyyedy et al. |
| 6,255,167 | B1 * | 7/2001 | Wu ................... H01L 27/11521 |
| | | | 257/E21.682 |
| 6,667,902 | B2 | 12/2003 | Peng |
| 6,713,839 | B2 | 3/2004 | Madurawe |
| 6,898,116 | B2 | 5/2005 | Peng |
| 6,940,751 | B2 | 9/2005 | Peng et al. |

(Continued)

*Primary Examiner* — Stephen W Smoot
(74) *Attorney, Agent, or Firm* — Aka Chan LLP

(57) ABSTRACT

A one time programmable nonvolatile memory formed from metal-insulator semiconductor cells. The cells are at the crosspoints of conductive gate lines and intersecting lines formed in a semiconductor substrate. Among others, features include forming the gate lines with polysilicon layers of one conductivity type and the intersecting lines with dopants of the opposite conductivity type in the substrate; forming the intersecting lines with differing dopant concentrations near the substrate surface and deeper in the substrate; and forming the widths of the gate lines and intersecting lines with the minimum feature size that can be patterned by a particular semiconductor technology.

30 Claims, 23 Drawing Sheets

(56) References Cited

U.S. PATENT DOCUMENTS

| | | | |
|---|---|---|---|
| 6,992,925 B2 | 1/2006 | Peng | |
| 7,110,278 B2 | 9/2006 | Keshavarzi | |
| 7,126,204 B2 | 10/2006 | Frey et al. | |
| 7,507,607 B1 | 3/2009 | Dark et al. | |
| 7,638,855 B2 | 12/2009 | Lung | |
| 8,330,189 B2 | 12/2012 | Luan et al. | |
| 2004/0155315 A1 | 8/2004 | Marr et al. | |
| 2007/0120171 A1 | 5/2007 | He et al. | |
| 2007/0205485 A1 | 9/2007 | Hsu et al. | |
| 2011/0298054 A1 | 12/2011 | Luan | |
| 2012/0147653 A1* | 6/2012 | Chung | H01L 27/101 365/103 |
| 2013/0161761 A1 | 6/2013 | Luan et al. | |

* cited by examiner

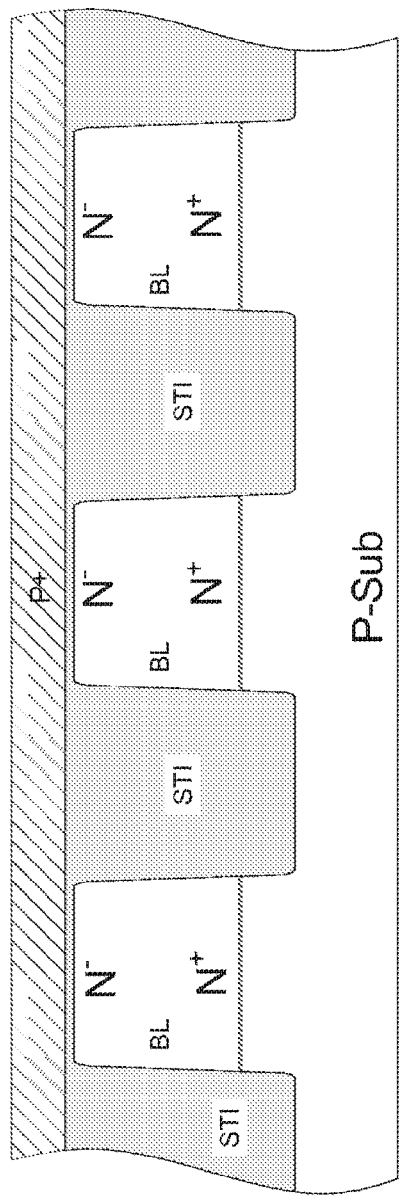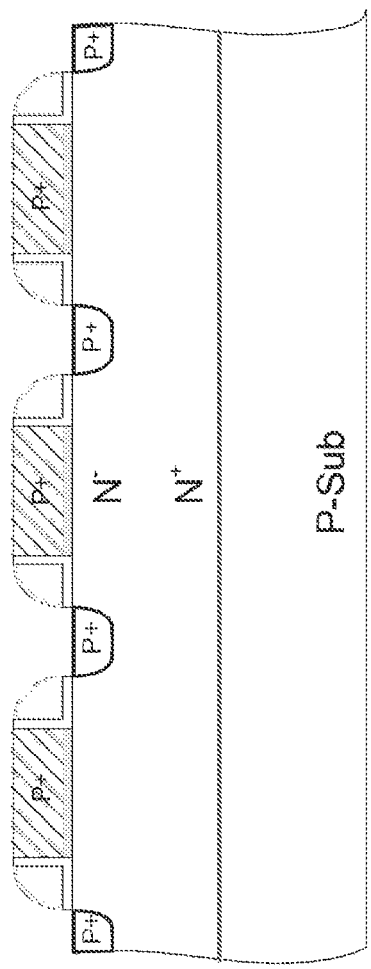
Figure 8A
Figure 8B

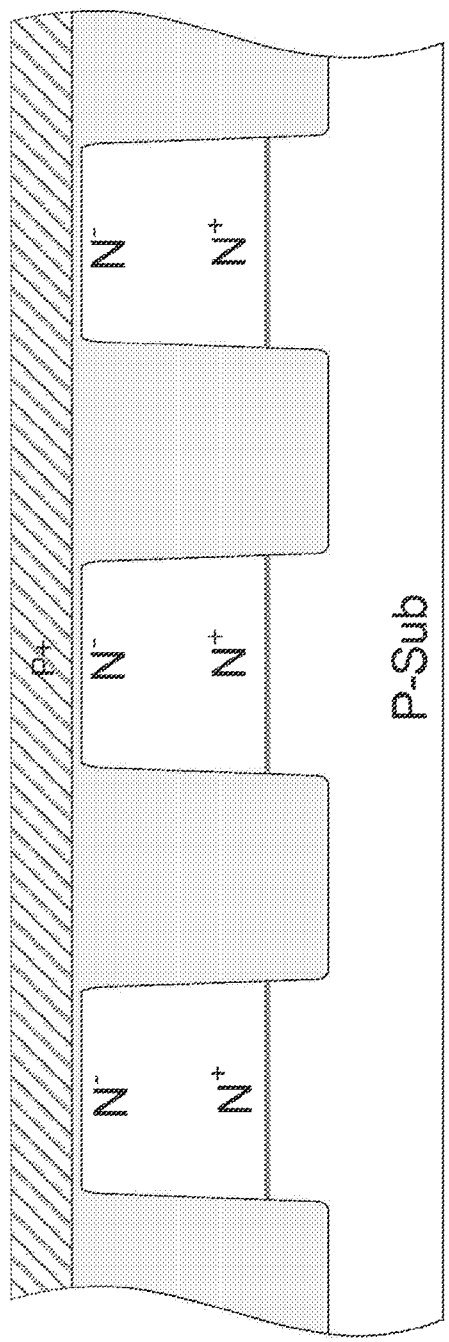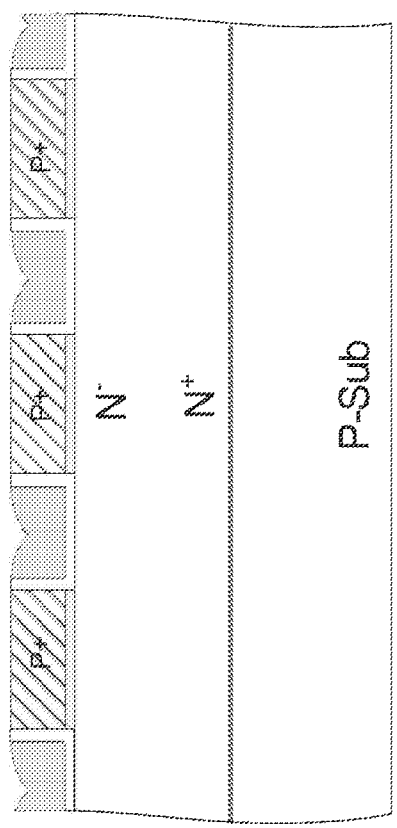
Figure 10A
Figure 10B

ONE-TIME PROGRAMMABLE MEMORY AND METHOD FOR MAKING THE SAME

CROSS-REFERENCE TO RELATED APPLICATIONS

This patent application is a continuation of U.S. patent application Ser. No. 14/681,852, filed Apr. 8, 2015, issued as U.S. Pat. No. 9,431,254 on Aug. 30, 2016, which is a divisional of U.S. patent application Ser. No. 14/250,267, filed Apr. 10, 2014, issued as U.S. Pat. No. 9,230,813 on Jan. 5, 2016, which is a continuation-in-part of U.S. patent application Ser. No. 13/687,925, filed Nov. 28, 2012, now abandoned, which is a continuation of U.S. patent application Ser. No. 12/819,566, filed Jun. 21, 2010, issued as U.S. Pat. No. 8,330,189 on Dec. 11, 2012. These applications are incorporated by reference along with all other references cited in this application.

BACKGROUND OF THE INVENTION

This invention relates to a nonvolatile programmable semiconductor memory, and more particularly, to a one-time programmable (OTP) anti-fuse memory for silicon-on-insulator processes.

Nonvolatile memory retains stored data when power is removed and is desirable in many different applications. As system-on-chips (SoCs) become more prevalent in consumer electronics and industrial applications, embedded nonvolatile memories have become more common. Embedded memory is incorporated onto the same underlying semiconductor die as non-memory circuitry.

The embedded memory is used for various purposes, among which are chip IDs, analog trimming, yield enhancement, and code storage. It would be advantageous if the embedded memories did not require added masks and process modifications to a standard CMOS flow. Thus, flash NAND or NOR memory that uses multiple polysilicon layers is not compatible with standard CMOS flow. However, gate dielectric based antifuse memory increasingly has become the choice of SoC chip designers because it is standard CMOS process based, reliable, and secure.

Gate dielectric anti-fused based memory can be broadly categorized into two groups, depending upon its operating principle. The first type is a cross-point memory consisting of a single capacitor at each gridpoint. The second type has more than two access lines for each cell in the memory array. A typical example is a storage capacitor or transistor coupled in series with a selection device such as a transistor or diode. Examples of the first type can be found in U.S. Pat. Nos. 6,898,116, 6,992,925, 7,638,855, and 7,110,278. An example of the second type is U.S. Pat. No. 6,667,902 (and the references cited therein).

Cross-point memory arrays are advantageous due to its compact layout and simple decoding. As a result, embedded OTP memories of the first type can be about eight times smaller than those of the second type. However, prior art cross-point OTP memories have drawbacks, such as significant process complexity, array leakage current, and reliability.

Furthermore, for embedded applications, it is very important to comply with logic layout design rules while introducing no extra process steps or only non-critical ones. As shown in prior art FIG. 1 (FIG. 2 of U.S. Pat. No. 7,638,855 to Lung), disclosed is a cross-point antifuse memory that requires significant changes in standard CMOS process flow and needs additional critical implant masks because the N+ bit lines and P-isolations are not self-aligned. In addition, the gate dielectric before programming and the P+/N+ diode formed after programming can have questionable quality.

U.S. Pat. Nos. 6,898,116 and 6,992,925, as illustrated in prior art FIG. 2 (FIG. 28 from the '925 patent), attempted to solve these problems using standard MOSFETs by adding buried N+ or P+ bodies. In the '925 patent, there are source and drain regions that extend under the sidewall spacers, thereby connecting to the channel region under the gates. Due to the presence of source and drain regions, however, there are two potential disadvantages with this cell. First, program disturb from inhibit voltages applied to the body can occur for un-selected cells where the gate is biased at zero voltage and body at Vpp. Due to impact ionization and other high voltage mechanisms, the floating source/drain can be charged up to a voltage well above ground. As a result, the MOSFET device can be fully inverted and a large percentage of the inhibit voltage drops across the gate dielectric. Secondly, the gate dielectric may breakdown at the overlap region between the gate and LDD. When this happens at two neighboring cells, there will be a path for leakage current during both programming and read operations.

U.S. Pat. No. 7,110,278 to Keshavarzi discloses a cross-point memory similar to that above except that the source and drain of each MOSFET is disconnected from its neighbors, as shown in prior art FIG. 3 (FIG. 2 of the '278 patent). The cell is bigger as a result of the non-continuous active regions. Furthermore, program disturb from the body can remain a problem because source and drain doped regions are still present for each MOSFET transistor.

BRIEF DESCRIPTION OF THE DRAWINGS

FIG. 8A shows a cross-sectional view of the FIG. 6 memory array taken along line A-A'; and FIG. 8B shows a cross-sectional view of the FIG. 6 memory array taken along line B-B'.

FIG. 10A shows a cross-sectional view of the FIG. 9 memory array taken along line A-A'; and FIG. 10B shows a cross-sectional view of the FIG. 9 memory array taken along line B-B'.

DETAILED DESCRIPTION OF THE INVENTION

Various embodiments of the present invention are now illustrated in following figures using terms commonly employed by those skilled in the art. It will be understood that they are not intended to limit the invention to these embodiments. The invention can be practiced without one or more of the specific details, or with other methods, components, materials. In other instances, well-known structures, materials, process steps, or operations are not shown or described in detail in order not to obscure aspect of the invention.

Figure 1:
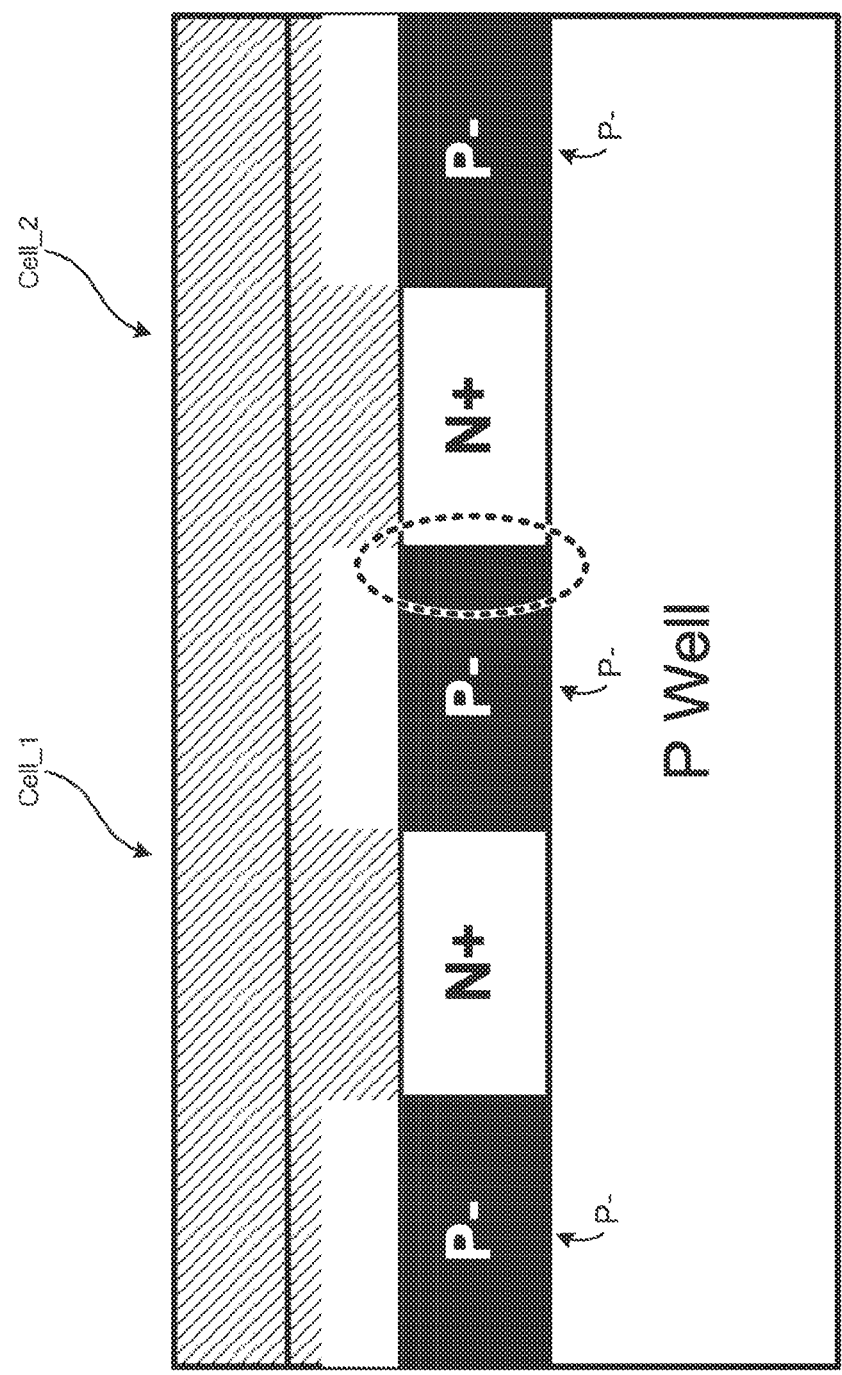
FIGS. 1-3 are prior art nonvolatile memory cells.
Figure 2:
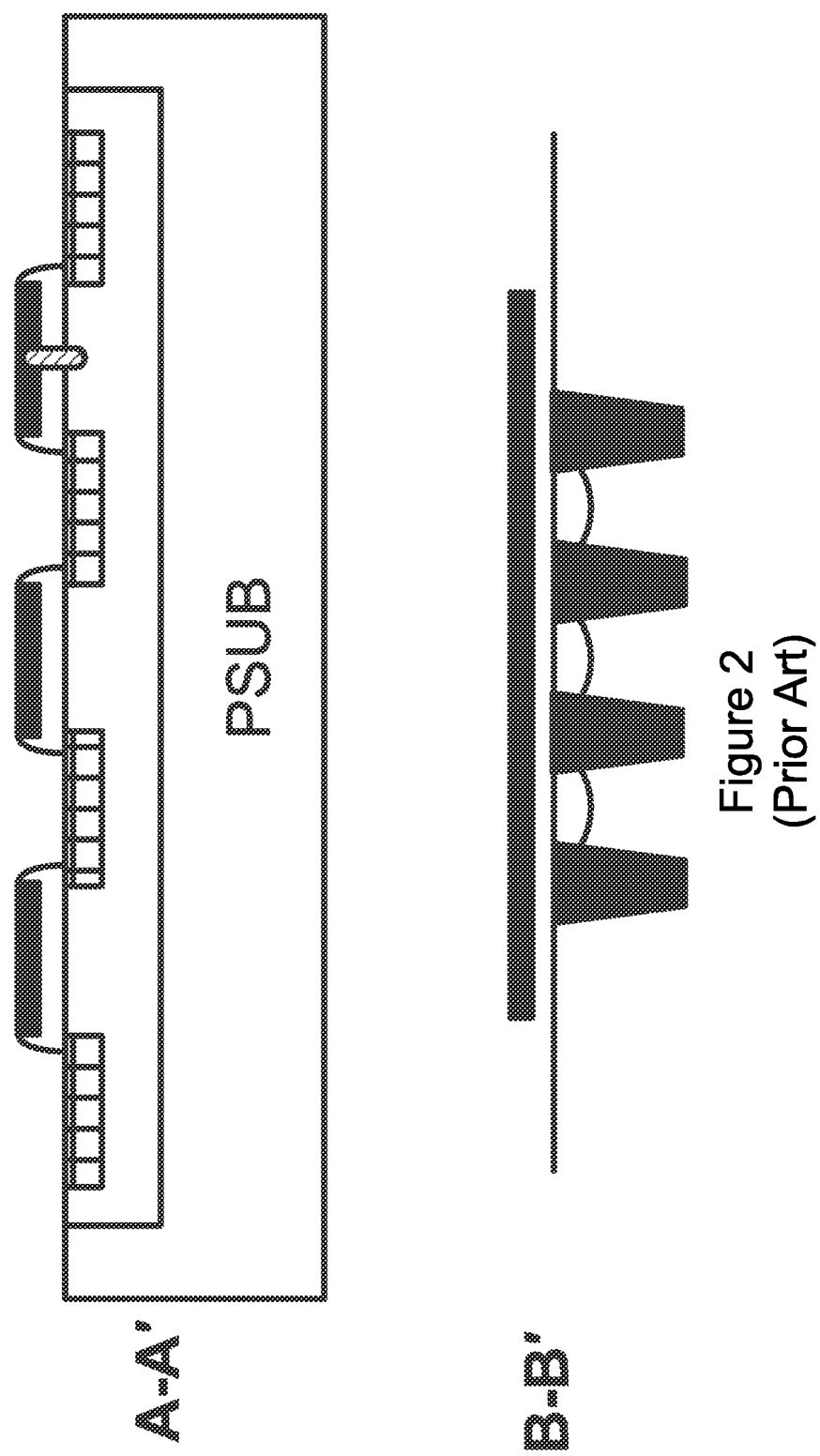
Figure 3:
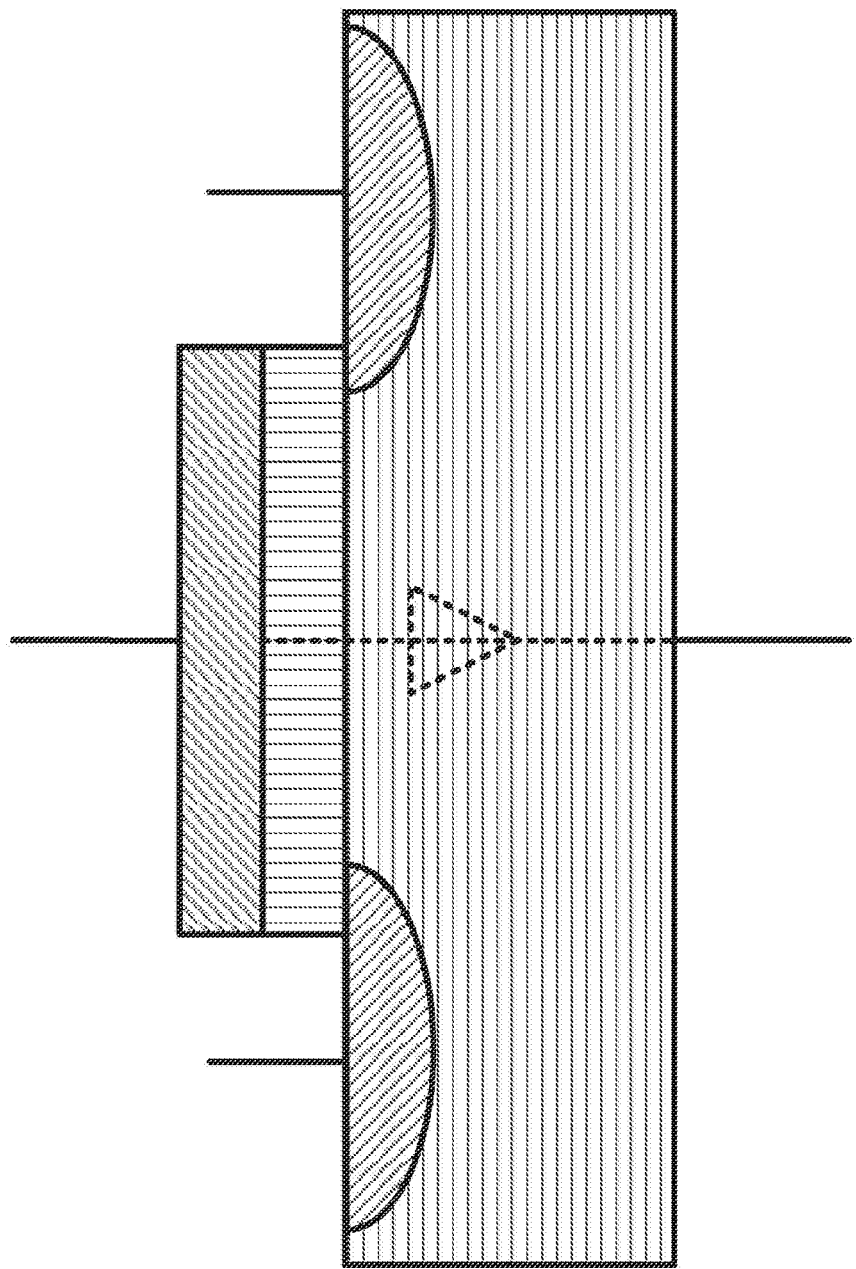
Figure 4:
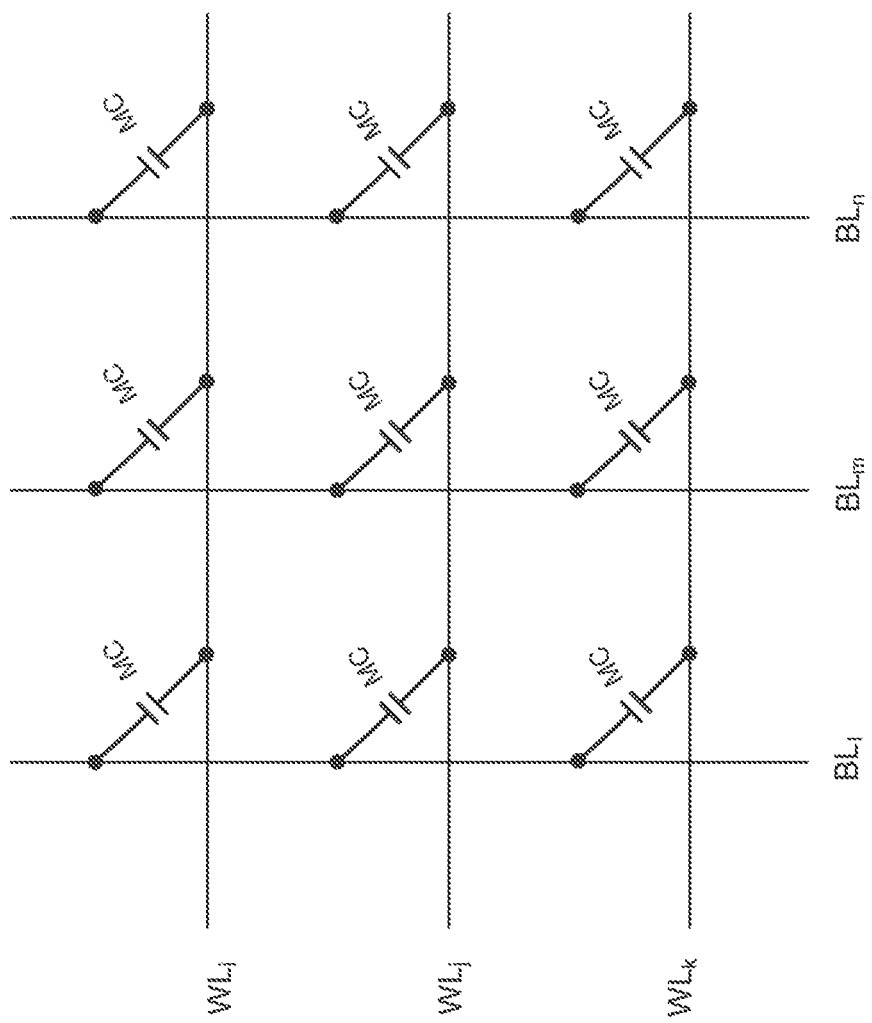
FIG. 4 shows schematically an unprogrammed memory array.

FIG. 4 illustrates a 3×3 cross-point memory array wherein each memory cell MC is shown before programming. Wordlines (WL) are positioned in the horizontal direction and bitlines (BL) in the vertical direction. Note that the orientation and terminology used to describe the lines may be switched or different terminology used altogether. A memory cell consisting of a "metal-insulator-semiconductor" (MIS) capacitor is located at each cross point. Note that while the term "metal" is used in MIS, the metal in many embodiments is actually doped polysilicon—in the context of the present disclosure, the term metal is meant to include any and all conductive structures. The WL and BL are so named for convenience only and they are, for example, referred to as rows (R) and columns (C) interchangeably in this specification. Further, the array may be of arbitrary size m by n, where m or n ranges, in one embodiment, from 1 to 1024, but may be larger.

Figure 5A:
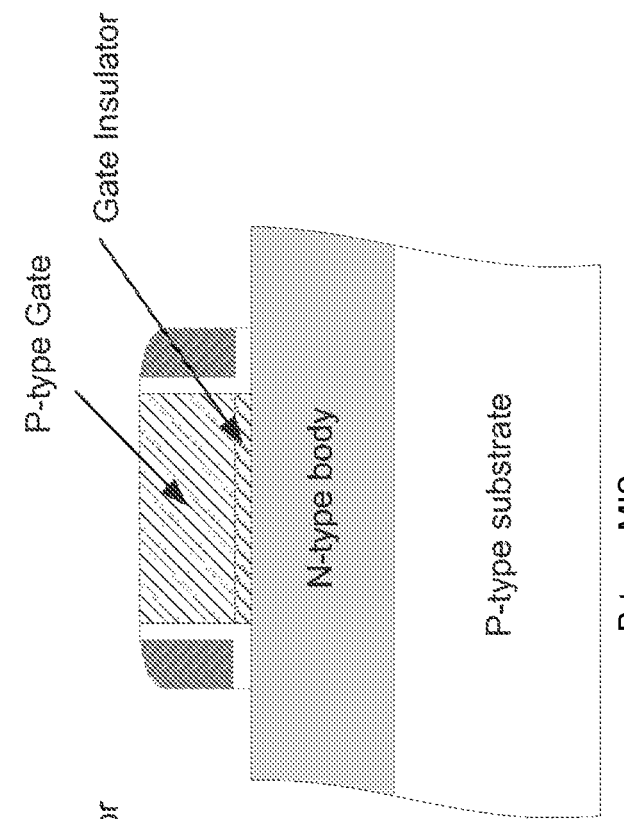
FIG. 5A shows a cross-sectional view of an N-type MIS for a memory cell in the FIG. 4 array.
Figure 5B:
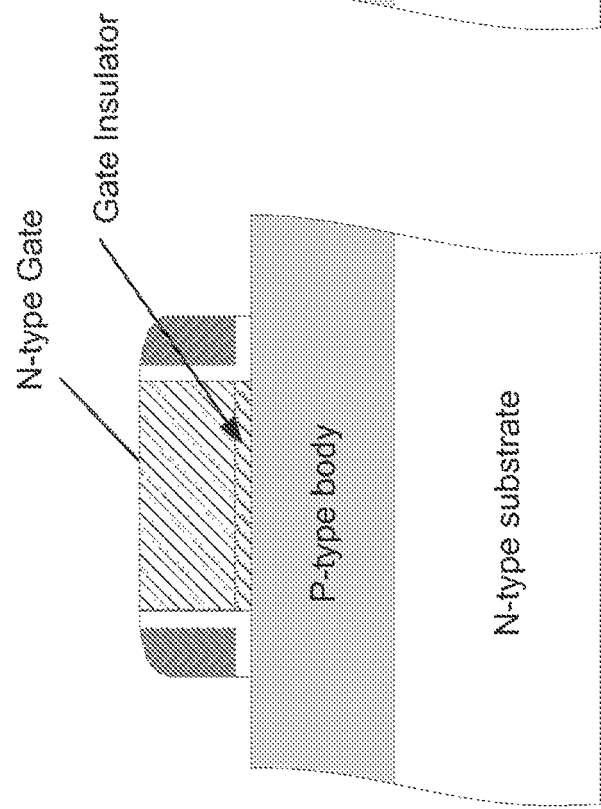
FIG. 5B shows a cross-sectional view of a P-type MIS for a memory cell in the FIG. 4 memory array.

FIGS. 5A-5B shows a cross-sectional view of two different types of the MIS memory cell. FIG. 5A is for an n-type MIS cell where the body is p-type and the gate is of n-type conductivity. FIG. 5B is for a p-type MIS cell where the doping is opposite to that of FIG. 5A. It should be noted that the cells have a gate stack which are the same as that of a standard MOSFET. However, there are no source/drain implants (charge reservoirs) physically connected to the channel. The gate dielectric can be of any commonly used materials in the industry such as oxide, nitride, oxynitride, and other high dielectric constant materials. For convenience, p-type doped poly gate conductors will be used to describe various embodiments. In practice, n-type doped poly or metal gate can be implemented as well.

Figure 6:
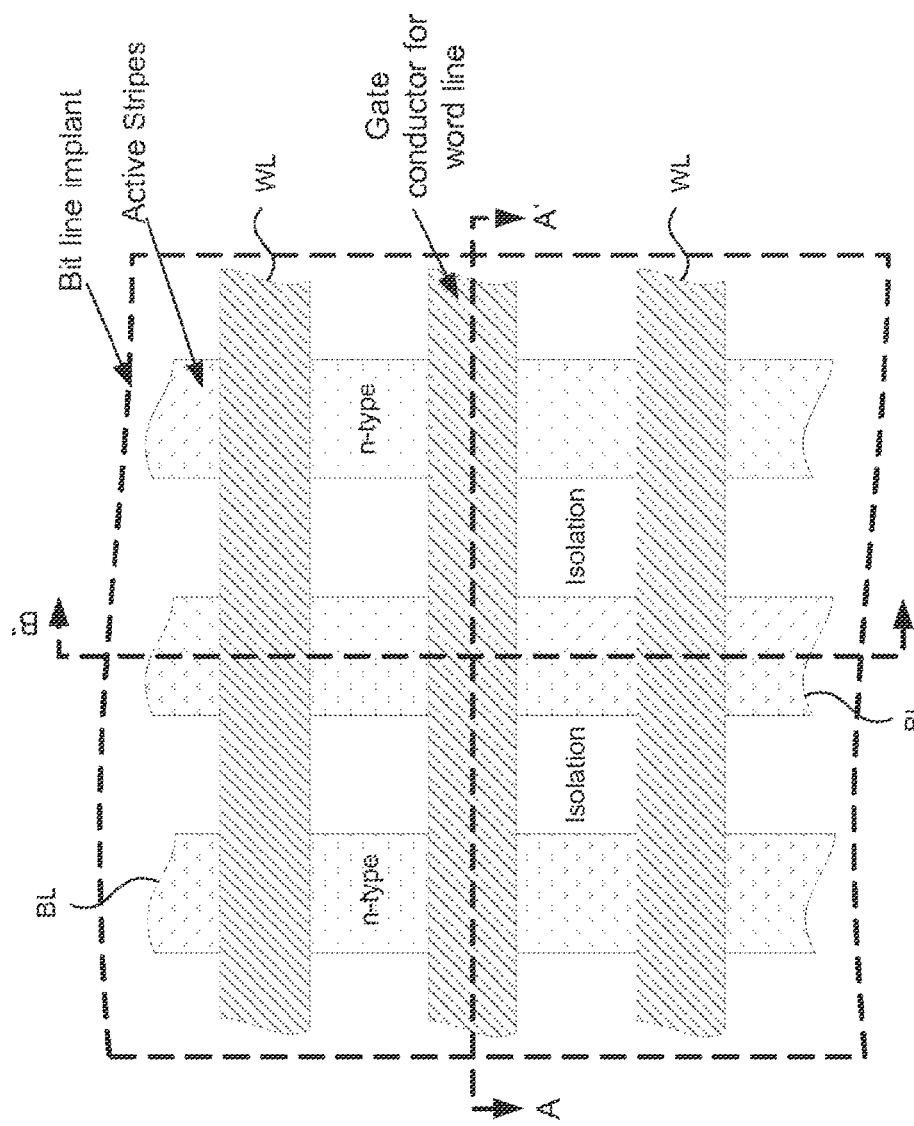
FIG. 6 shows a top plan view of a memory array.

In accordance with a disclosed embodiment, FIG. 6 shows a partial layout diagram of a 3×3 array. For simplicity, only a few relevant layers are drawn. Active stripes are formed in vertical stripes in the substrate. The active stripes are formed by a doping implant. For a p-type doped poly gate conductor, the implant would be an n-type implant into a p-type substrate. A typical doping concentration for the n-type bitlines BL could range from $1 \times 10^{18}$ to $1 \times 10^{19}$. In one embodiment, the width of the stripes range from between 1× to 2× of the minimum feature size (F) that can be patterned at a given technology node. Formed between the active stripes are isolation regions, which may be, as an example, LOCOS or shallow trench isolation (STI). Isolation regions may also be formed from floating doped regions and any other myriad types of isolation structures used in the industry. The width of the isolation regions between active stripes may also range between 1× to 2× of the minimum feature size F.

Still referring to FIG. 6, arranged in horizontal stripes are gate conductor wordlines WL. Like the bitlines BL, the WL width and spacing therebetween ranges from 1× to 2× of the minimum feature of a given process technology. Thus, for high density applications, the cell size can be as low as $4F^2$, assuming that the width of the BL, WL, and isolation spacings are all at the minimum feature size.

Figure 7:
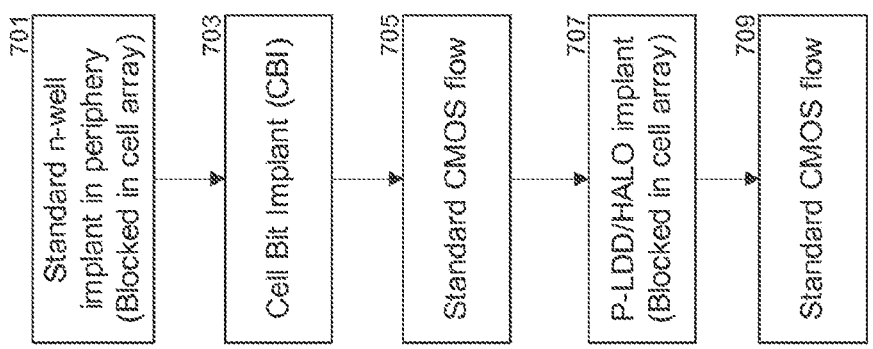
FIG. 7 is a flow diagram of the process steps for manufacturing the memory

As noted, the embodiments disclosed herein follow standard CMOS process flow except for the addition of a bitline BL implant mask that is used to form the bitlines (active stripes) in the substrate. FIG. 7 shows a process flow that may be used to manufacture the disclosed embodiments. First at box 701, a standard n-well implant is performed generally in those areas outside of the memory array. Those of skill in the art recognize that n-wells are conventionally formed in a p-type substrate in a CMOS process.

While the n-wells are being formed, a mask is used to cover the memory array region. The mask covers the memory array while the n-wells are formed. Next, the mask is further exposed and developed to provide a bitline mask. Thus, the mask serves two purposes: (1) to cover the memory array while n-wells are being formed in other areas of the substrate, and (2) after the mask is further defined, to use as a bitline mask to form the active stripes. In some embodiments, this process may be performed by two separate masks.

Next at box 703, once the bitline mask has been formed, the active stripes are formed by implantation of the n-type dopant. As will be seen below, the active stripes in one embodiment have an n+ deeper implant and an n− shallower implant. The active stripe implant (also referred to as a cell bitline implant (CBI)) may be done either before or after the regular n-well implant, without extra thermal annealing. In this embodiment, the implant is n-type dopant, similar to the n-well implant, but with a lower energy. The retrograde implant profile (where there is an n+ deeper in the substrate and an n− shallower) aids in program disturb and reverse leakage considerations.

In some embodiments, it is advantageous to have the CBI: (1) have its n-p substrate junction shallower than the isolation STI (see FIGS. 8A-8B), and (2) have a super retrograde profile so that the BL resistance is low. For example, a reasonable value is about 500 ohm to 3000 ohm between two BL strap contacts. Those skilled in the art will appreciate that the standard process modules such as the shallow trench isolation (STI), p-well implant, well annealing, and other processes are skipped for clarity and referred to as the standard CMOS flow.

FIG. 8A is a cross-sectional view of FIG. 6 taken along A-A'. Due to the use of lower energy implants, BLs consists of heavily doped n+ regions near BL/p-Sub junction and lightly doped n− regions near the gate dielectric interface. The bitlines BL are separated by STI isolations (though other isolation structures may be used) so that there is no leakage between BLs.

FIG. 8B is a cross-sectional view of FIG. 6 taken along the line B-B'. Note that the cross section is different from standard PMOSFETs due to the removal of LDD/HALO implants. P+ doped regions formed in the substrate can be formed from the standard p+ source/drain implant and self-aligned to the sidewall spacers. Note that they are electrically floating and not physically connected to the channel regions. Unlike the prior art, the p+ regions do not extend to under the gate, and thus are not in electrical contact with a channel region under the gate. The sidewall spacers on the gates separate the p+ regions from the channel.

Indeed, as noted above, the p+ floating regions are not part of the active cell devices and therefore are optional (and can be masked out). However, to avoid additional masking steps, they can be left in (since they are floating and electrically isolated) and are formed from self-aligned source/drain implant when standard CMOS poly gate design rules are used.

Figure 9:
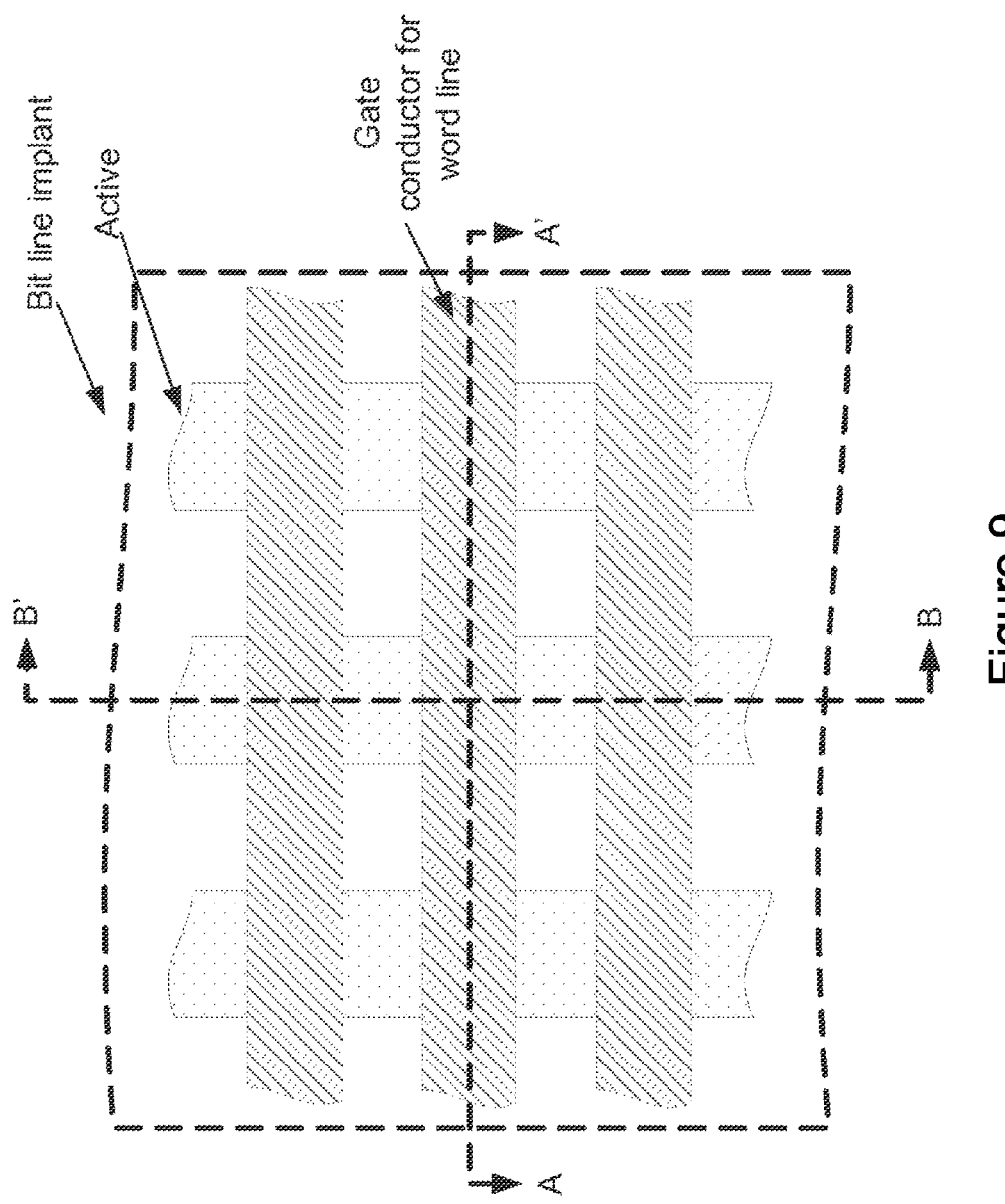
FIG. 9 shows a top view of a second embodiment of a memory array.

One way to eliminate the optional p+ floating regions is illustrated in FIGS. 9 and 10, which show another embodiment of the memory array. Here the gate spacing is so designed such that when standard sidewall spacer deposition is performed, the sidewall spacers conformally fills the space between adjacent wordlines WL As a result, as seen in FIG. 10B, the space between adjacent gates are substantially filled after spacer etch. This prevents the p+ source/drain implants from reaching the semiconductor substrate. Cross-sectional views along both A-A' and B-B' of FIG. 9 are shown in FIGS. 10A-10B. As seen in FIG. 10B, there are no p+ regions in the substrate. The benefit of this cell is a more compact array with a potential cell size of $4F^2$.

Figure 11:
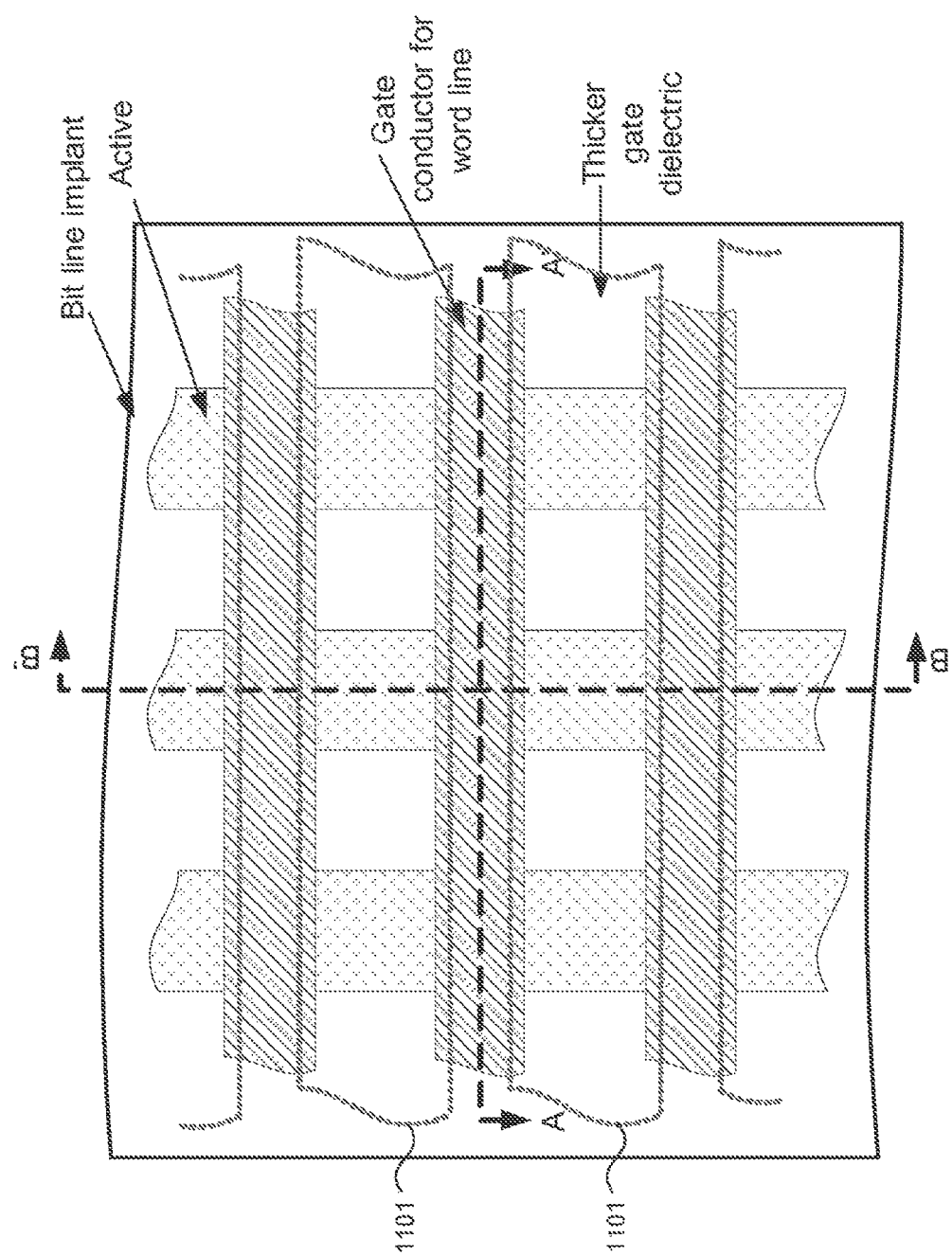
FIG. 11 shows a third embodiment of a memory array.
Figure 12A:
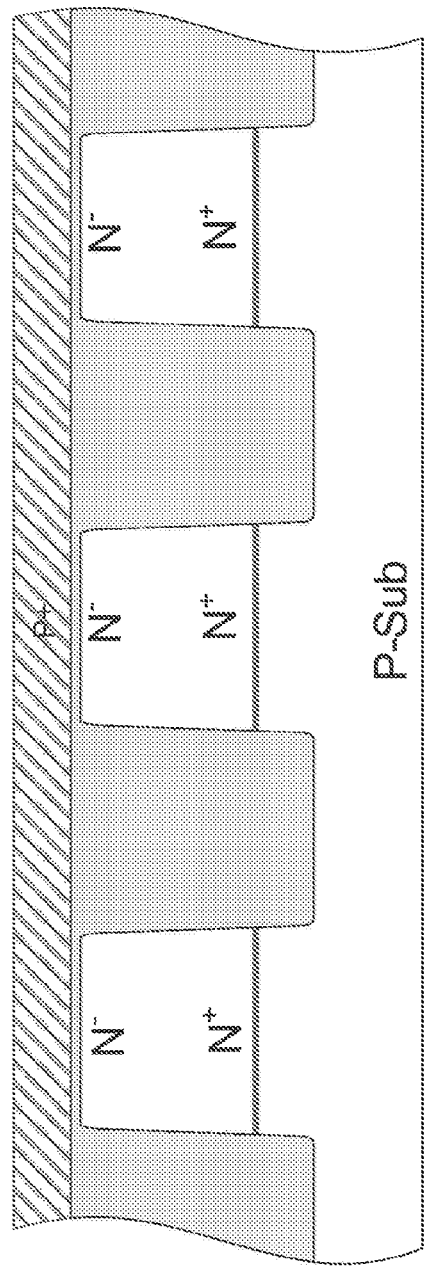
FIG. 12A shows a cross-sectional view of the FIG. 11 memory array taken along line A-A'.
Figure 12B:
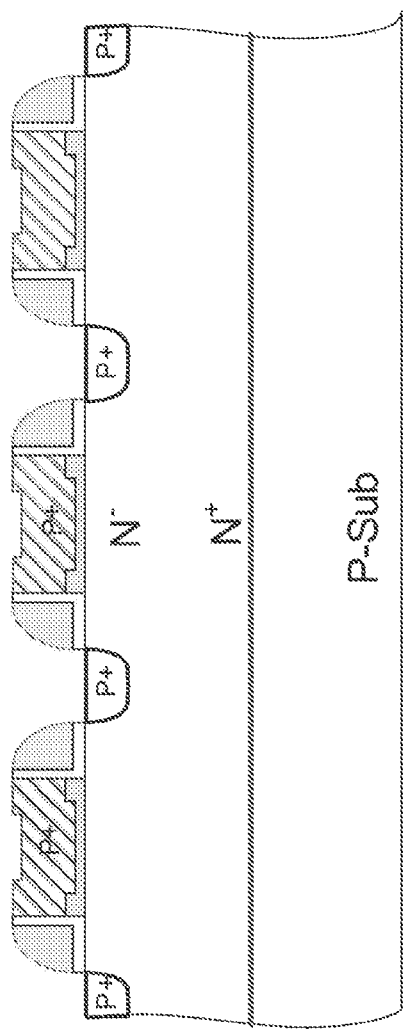
FIG. 12B shows a cross-sectional view of the FIG. 11 memory array taken along line B-B'.

Yet another embodiment is illustrated in FIGS. 11 and 12. The memory cell can be made from standard dual-oxide CMOS processes. In this embodiment, the gate oxide underneath the gate has a thicker region and a thinner region. The gate dielectric formed under a thicker gate dielectric mask is used to grow a thicker gate dielectric 1101, which can be the same as that of standard I/O oxide. The objective is to further restrict the breakdown locations away from the gate edges so that cell to cell sneak leakages can be significantly reduced. An example of the use of a thicker gate oxide is shown in commonly assigned U.S. Pat. No. 6,940,751, which is herein incorporated by reference. Cross-sectional views are shown in FIGS. 12A-12B.

It can be appreciated that various combinations of the multiple concepts described herein may be combined into yet other embodiments. For example, the thicker gate oxide technique may be combined with the blocked source drain implant of FIGS. 9 and 10.

Figure 13:
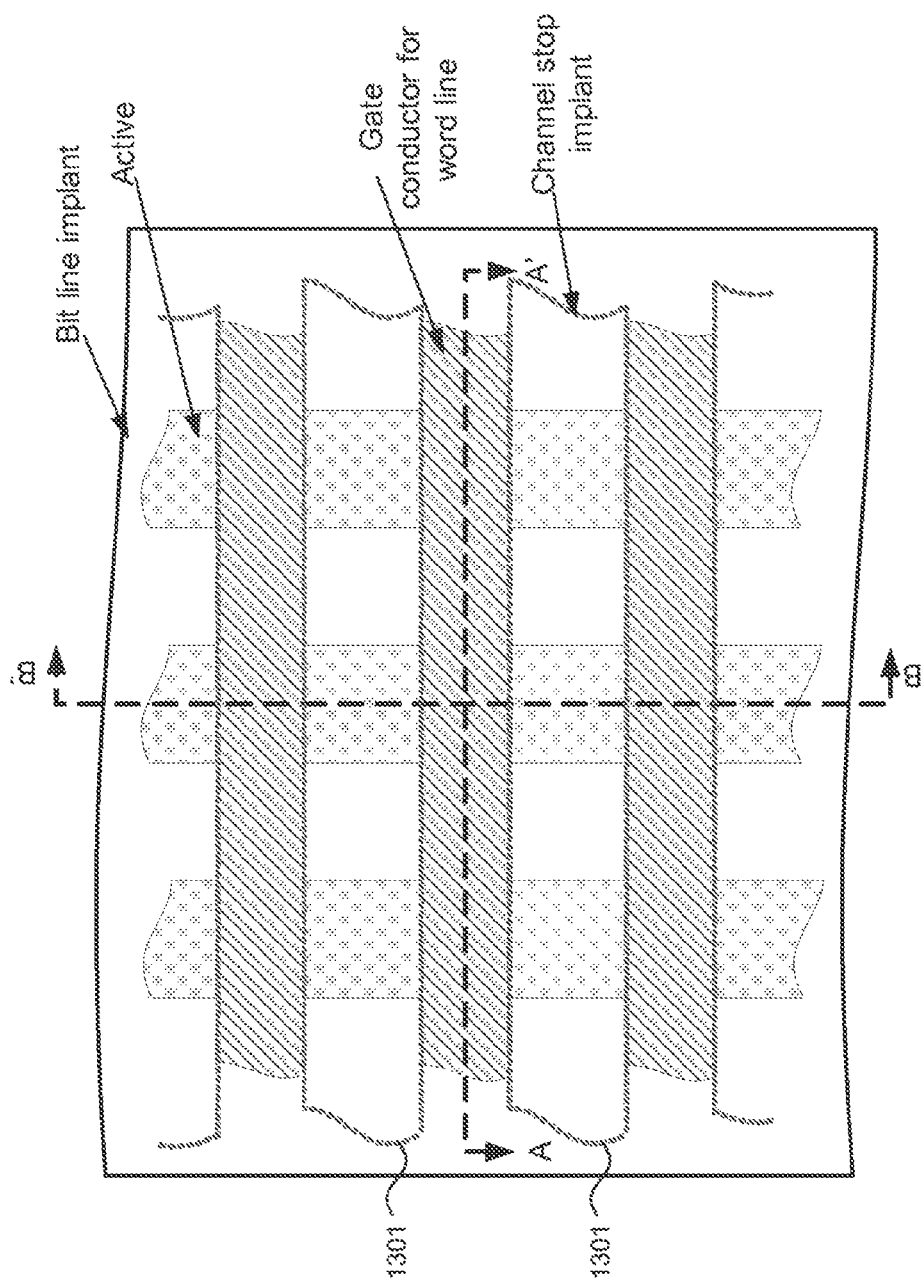
FIG. 13 shows a fourth embodiment of a memory array.
Figure 14A:
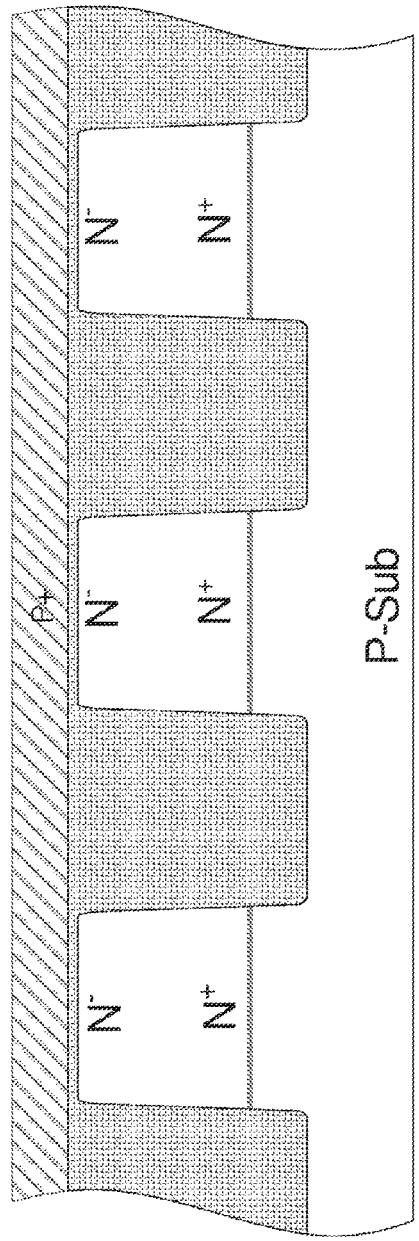
FIG. 14A shows a cross-sectional view of the FIG. 13 memory array taken along line A-A'.
Figure 14B:
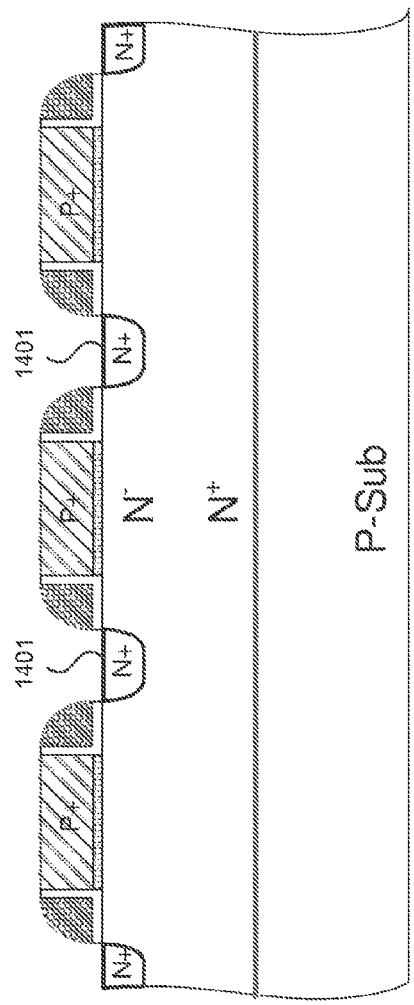
FIG. 14B shows a cross-sectional view of the FIG. 13 memory array taken along line B-B'.

Still, in yet another embodiment, the floating doped semiconductor regions can be n+-type. As shown in FIGS. 13 and 14, a channel stop implant layer 1301 is used to block the p+ source/drain implant and to open an n+ channel stop implant 1401. Cross-sectional views are given in FIGS. 14A-14B. Although this structure provides even better cell to cell leakage current protection after they are programmed, it does require extra process steps and the addition of critical implant masks, with the associated alignment tolerance issues.

Figure 15:
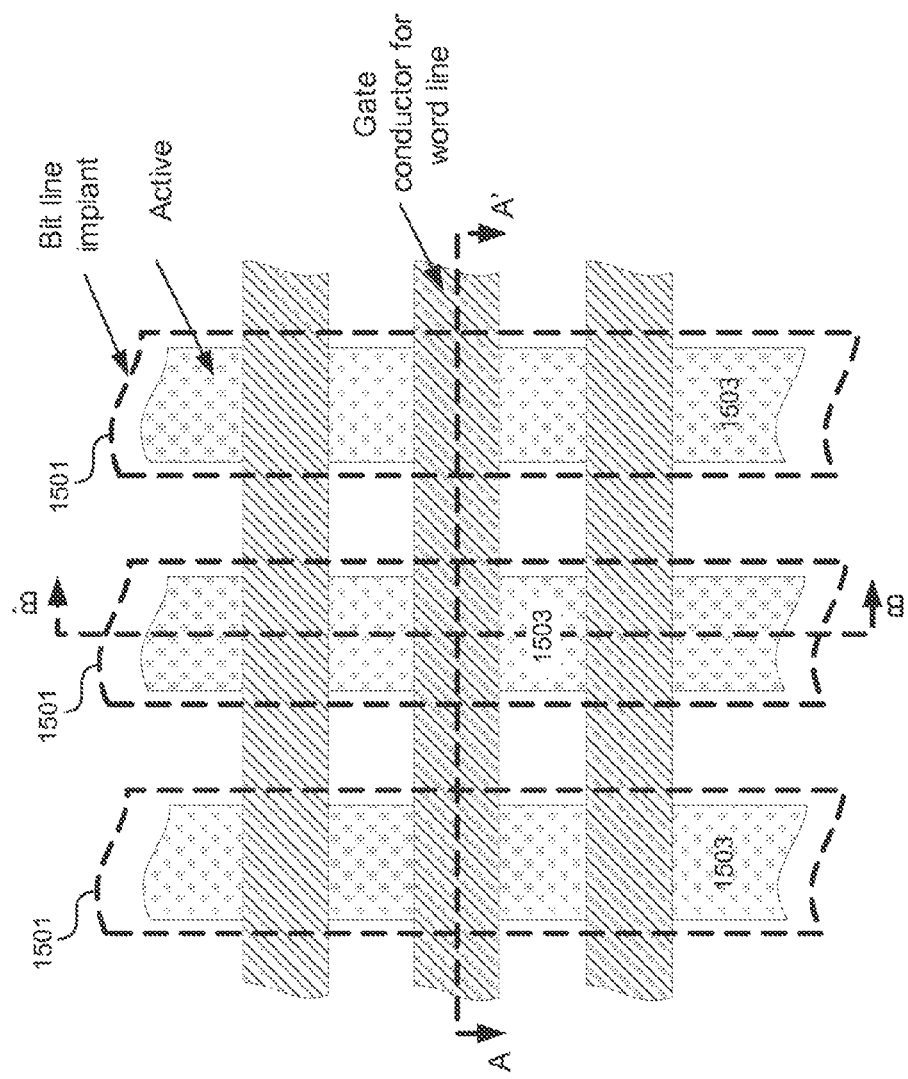
FIG. 15 shows a fifth embodiment of a memory array.

For OTP memories of smaller capacity, the memory array itself is a relatively small percentage of the total die area. In these embedded applications, it is advantageous to develop antifuse memories without introducing added mask and process steps in addition to standard CMOS processes. As such, yet another embodiment eliminates the additional CBI mask described above. FIG. 15 shows a layout view of this embodiment.

Figure 16A:
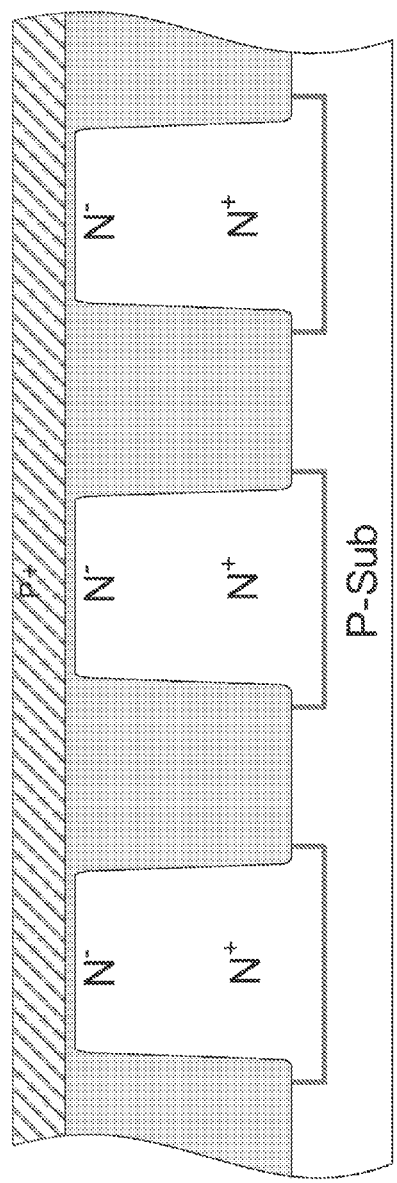
FIG. 16A shows a cross-sectional view of the FIG. 15 memory array taken along line A-A'.
Figure 16B:
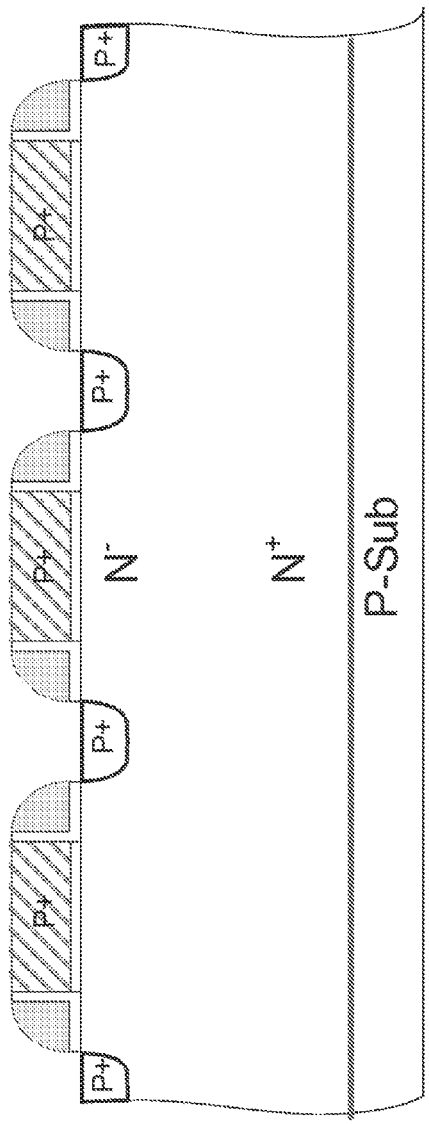
FIG. 16B shows a cross-sectional view of the FIG. 15 memory array taken along line B-B'.

In this embodiment, the bit line implant 1501 is the standard n-well implant mask. Instead of covering the whole memory array area, the n-well implant mask covers each active stripe 1503 individually. N-well spacing is designed to prevent BL to BL leakage during programming. The cell size of this embodiment is larger than the others because the regular n-well is deeper than that of STI. Cross-sectional views are given in FIGS. 16A-16B.

Note that the above embodiments are for p-type MIS cells and can be easily switched to n-type MIS cells. Programming and read operations are the same for all p-type implementations. A simple polarity change applies to all n-type MIS cell embodiments.

Figure 17:
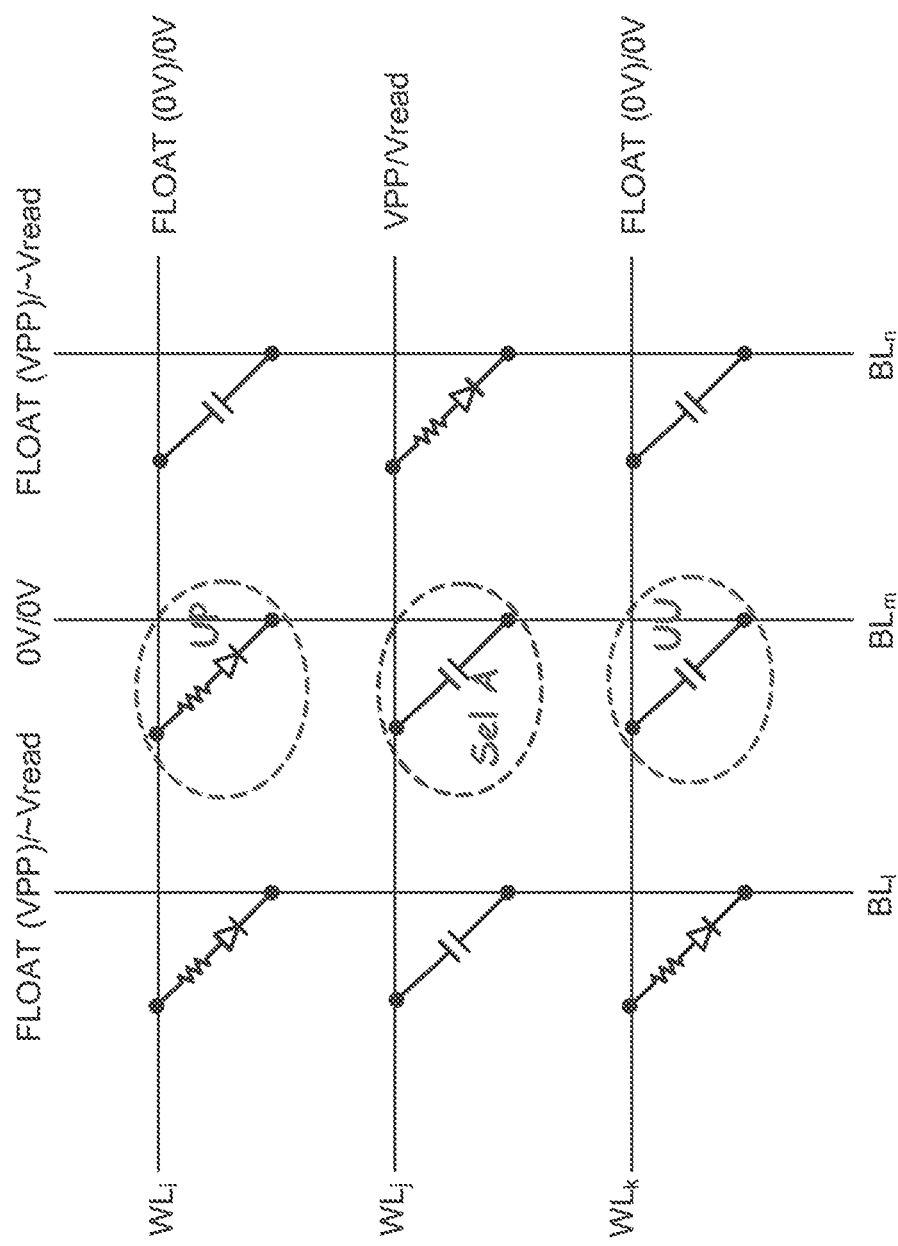
FIG. 17 shows a memory array during programming and reading.

With FIG. 17 as a reference for a p-type cell implementation, Table 1 below provides example bias conditions for both programming and read operations. The cell marked by 'Sel A' is assumed to be the selected cell for both program and read. Here the program Vpp and read Vread are for example only and their actual levels depend on the specific process technology used. For gate dielectrics with thickness of 6 nm to 32 nm, Vpp and Vread are preferred to be in the range of 3V-9V and 0.7V-3.3V, respectively. For the selected cell 'A', the capacitor is under accumulation and the full Vpp is applied across its gate dielectric. Its gate dielectric breaks down and the cell is programmed.

For an un-selected cell at (WLi, BLn), the MIS capacitor is under deep depletion and the cell will not be disturbed. For the un-selected cell at (WLi, BLl), the programmed cell behaves as a reverse biased diode and its leakage current is extremely small. There is no effective voltage developed across MIS cells at (WLj, BLl) and (WLj, BLn). During read operations, bias conditions are similar to those of programming except the change from Vpp to Vread.

As described above, the optional floating p+ doped regions (first seen in FIG. 8B) are a result of self-aligned poly gate and source/drain ion implantations in standard CMOS processes. In general, the occurrence of the p+ doped regions is undesirable in certain cell array operations. For example, wordline to wordline leakage can potentially occur if the gate sidewall spacer is not thick enough and two neighboring memory cells breakdown at the gate edges towards the same p+ region. Further, bitline sheet resistance can be much higher underneath the p+ regions compared to those under the gate. The above embodiments to remove the p+ doped regions have potential drawbacks in that they either require an extra critical mask or the gate spacing is pushed to be smaller than standard CMOS design rules. Specifically, while the teachings of the embodiment of FIGS. 10A-10B may also result in the removal of the p+ doped regions, in order to achieve that result using sidewall spacers, the narrow spacing between adjacent gates may be difficult to obtain in a viable manufacturing context.

The additional embodiments described below address these issues. The first embodiment described is to "predope" the polysilicon gate. In other words, in contrast to other embodiments, the polysilicon layer is doped prior to masking and etching into the gate structure. The layout of the memory array is the same cross-point memory array, like that shown in FIG. 6. In this embodiment, a mask, such as but not necessarily a cell bitline implant (CBI) mask, is used to perform a p+ doping of the polysilicon after the polysilicon deposition. This p+ doping of the polysilicon is done prior to the gate etch.

Figure 18:
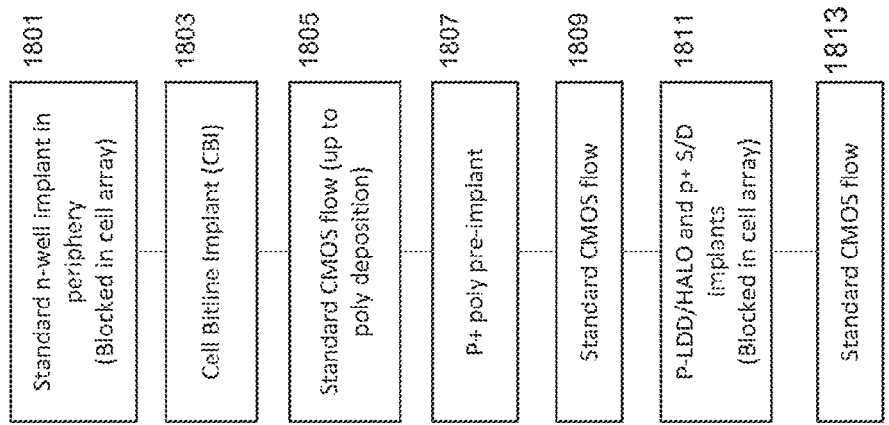
FIG. 18 is a flow diagram of the process steps for manufacturing of the memory array of the embodiment of FIGS. 19A-19B.

FIG. 18 is a simplified process flow of this embodiment. As can be seen, in this process (contrasted to FIG. 7), a gate polysilicon "p+ poly pre-implant" step 1807 is performed after the polysilicon deposition at 1805. Note that step 1805 is meant to represent a myriad of conventional semiconductor manufacturing process steps up to and even after the deposition of the gate polysilicon layer. Various embodiments and process nodes will have different combination of steps at box 1805. However, what is important in this embodiment is that the p+ poly pre-implant is performed prior to the gate etching step at the standard CMOS flow box 1809. The implant dose and energy can be the same as those used for a standard p+ source and drain implant for a particular process node.

Figure 19A:
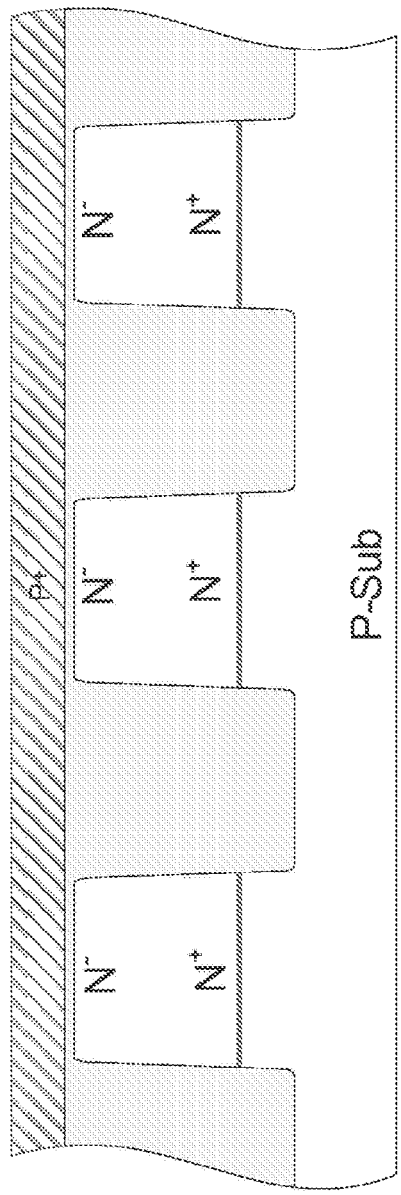
FIG. 19A shows a cross-section view of an alternative embodiment of the FIG. 6 memory array taken along line A-A'.
Figure 19B:
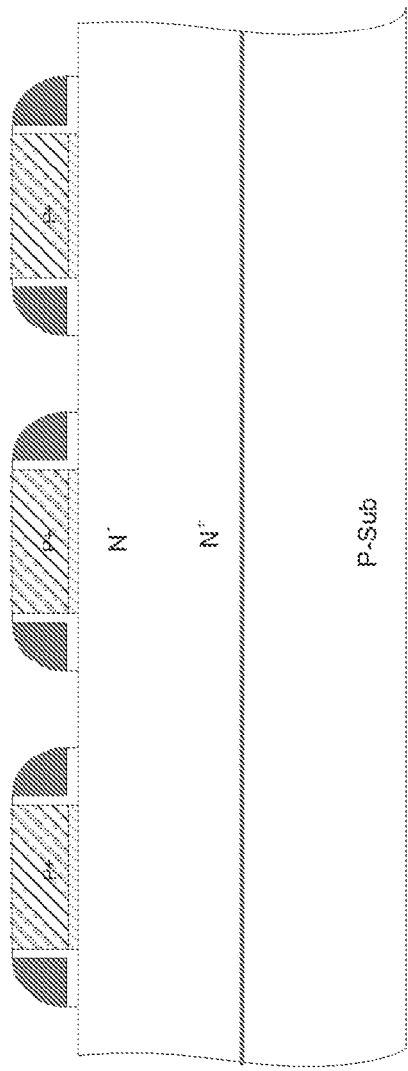
FIG. 19B shows a cross-section view of the alternative embodiment of the FIG. 6 memory array taken along line B-B'.

With the gate poly pre-implanted, the standard p+ source/drain implant at box 1811 can be blocked in the memory cell array after the gate etch. As a result, the cell array has high conductivity p+ poly gate without p-LDD (lightly doped drain) and p+-S/D regions, as shown in FIGS. 19A-19B.

Figure 20:
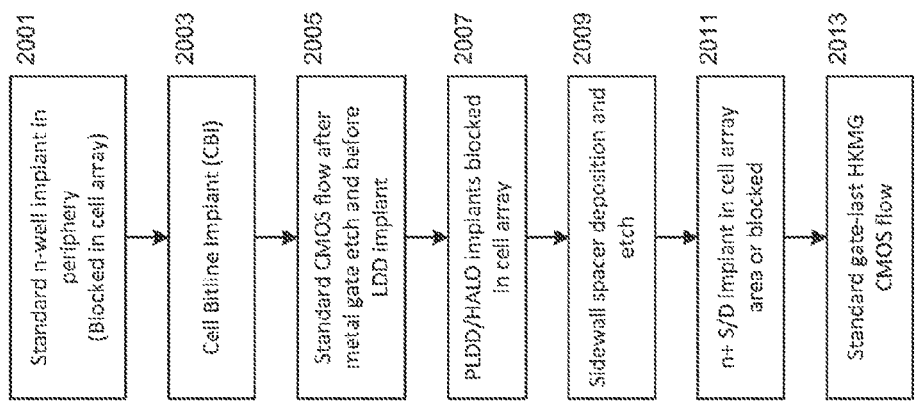
FIG. 20 is a flow diagram of the process steps for the manufacturing of the memory array of the embodiment of FIGS. 21A-21B.

Yet another alternative embodiment is shown in FIG. 20. This embodiment may be used, as one example, in conjunction with CMOS processes with high-k gate dielectrics and/or replacement metal gate. In such a situation, the polysilicon pre-implant of FIG. 18 is not necessary.

FIG. 20 shows an alternative brief process flow. In this process flow, p-type lightly doped drain and halo implantations at box 2007 are blocked in the memory cell array portion of the semiconductor die. The halo implant is known in the art and is used in standard CMOS fabrication to suppress punch-through effect. It is a low energy, low current implantation carried out at large incident angle so that implanted dopants penetrate underneath the edge of the MOS gate stack.

At step 2009, the sidewall spacers are formed. At step 2011, there are two alternatives whereby the n+ source/drain implants (commonly used in CMOS process) are either blocked in the cell array or are unblocked in the cell array. Finally, at step 2013, the remaining steps in a standard high-k metal gate process are completed.

Figure 21A:
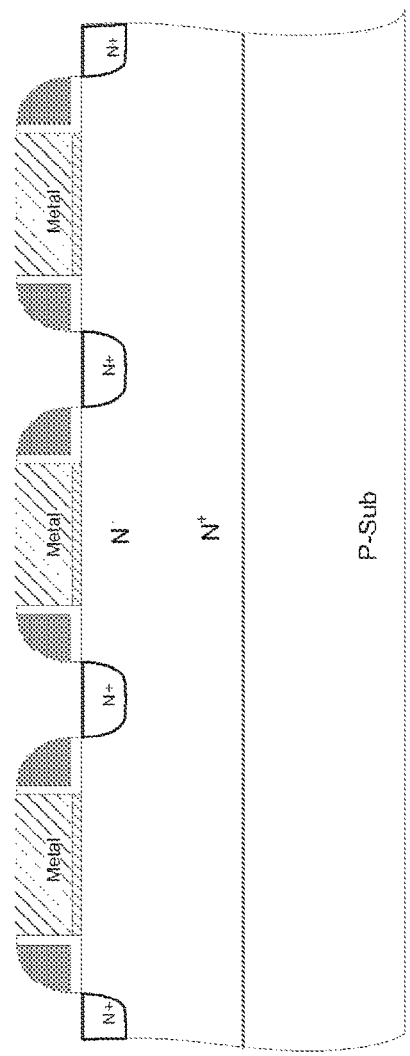
FIG. 21A shows a cross-section view of an alternative embodiment of the FIG. 6 memory array taken along line A-A'.
Figure 21B:
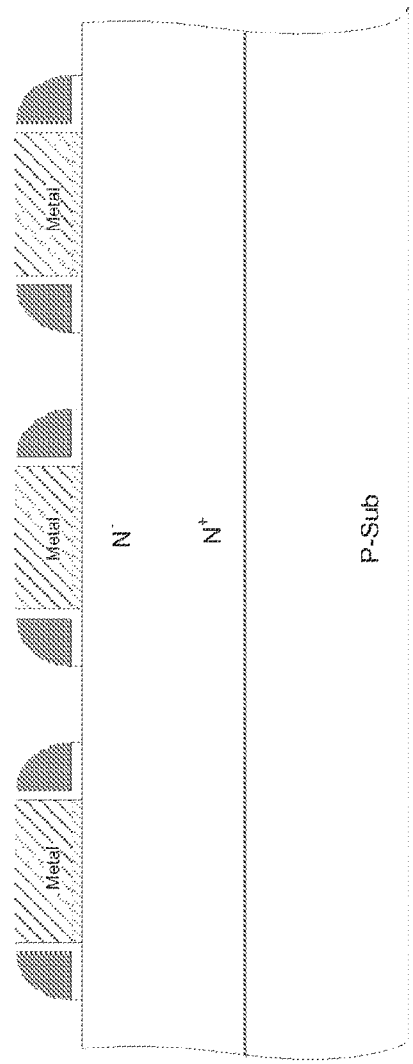
FIG. 21B shows a cross-section view of the alternative embodiment of the FIG. 6 memory array of taken along line B-B'.

FIGS. 21A-21B illustrates two different cell structures: FIG. 21A shows the cell with the n+ source/drain implant and FIG. 21B shows the cell without the n+ source/drain implant in the cell array. The structure of FIG. 21A has at least two advantages: (1) bitline resistance is reduced due to the much higher conductivity of the n+ regions, and (2) the n+ regions can prevent any possible wordline to wordline leakage after adjacent cells are programmed.

Figure 22A:
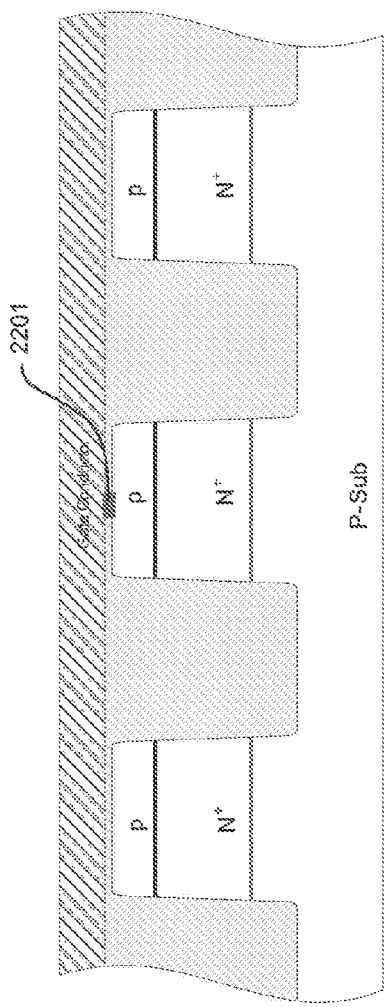
FIG. 22A shows a cross-section view of an alternative embodiment of the FIG. 6 memory array taken along line A-A'.
Figure 22B:
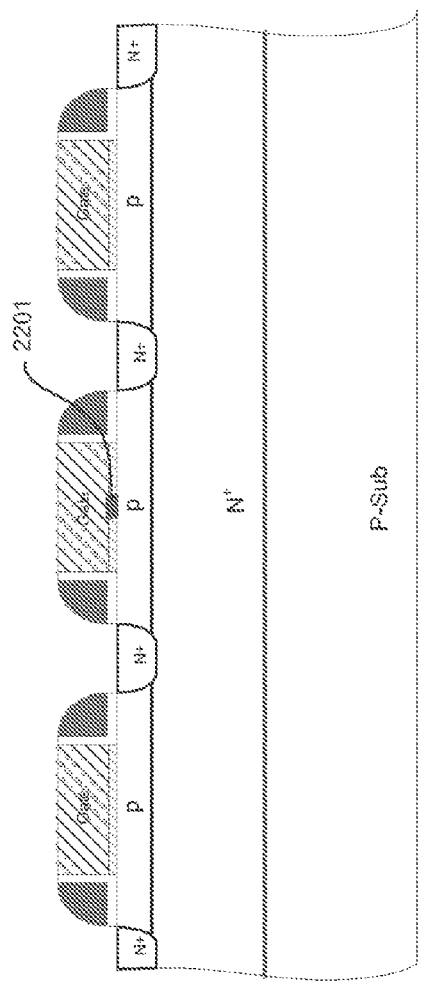
FIG. 22B shows a cross-section view of the alternative embodiment of the FIG. 6 memory array taken along line B-B'.

Finally, a last embodiment is shown in FIGS. 22A-22B which improves parasitic leakage in the memory array. For the exemplary embodiments shown above, diodes are formed between a wordline and bitline after the cell is programmed. As shown in FIG. 17, the diode at WLi and BLI is reverse-biased at Vpp or Vread during programming and read of cell 'A', respectively. If many of these diodes are "leaky" during reverse bias in the cell array, programming or read of the selected cell 'A' can become difficult. It is well known that diodes formed post dielectric breakdown are not well controlled and of lower quality than process diodes formed from dopant diffusion or implant. This can be particularly true for metal gates where the Schottky contact (between the metal gate and silicon substrate) formed post-breakdown can be much more leaky compared to doped polysilicon. One way to further improve the memory cell array leakage is to have process diodes between wordlines and bitlines even prior to the cells being programmed.

Figure 23:
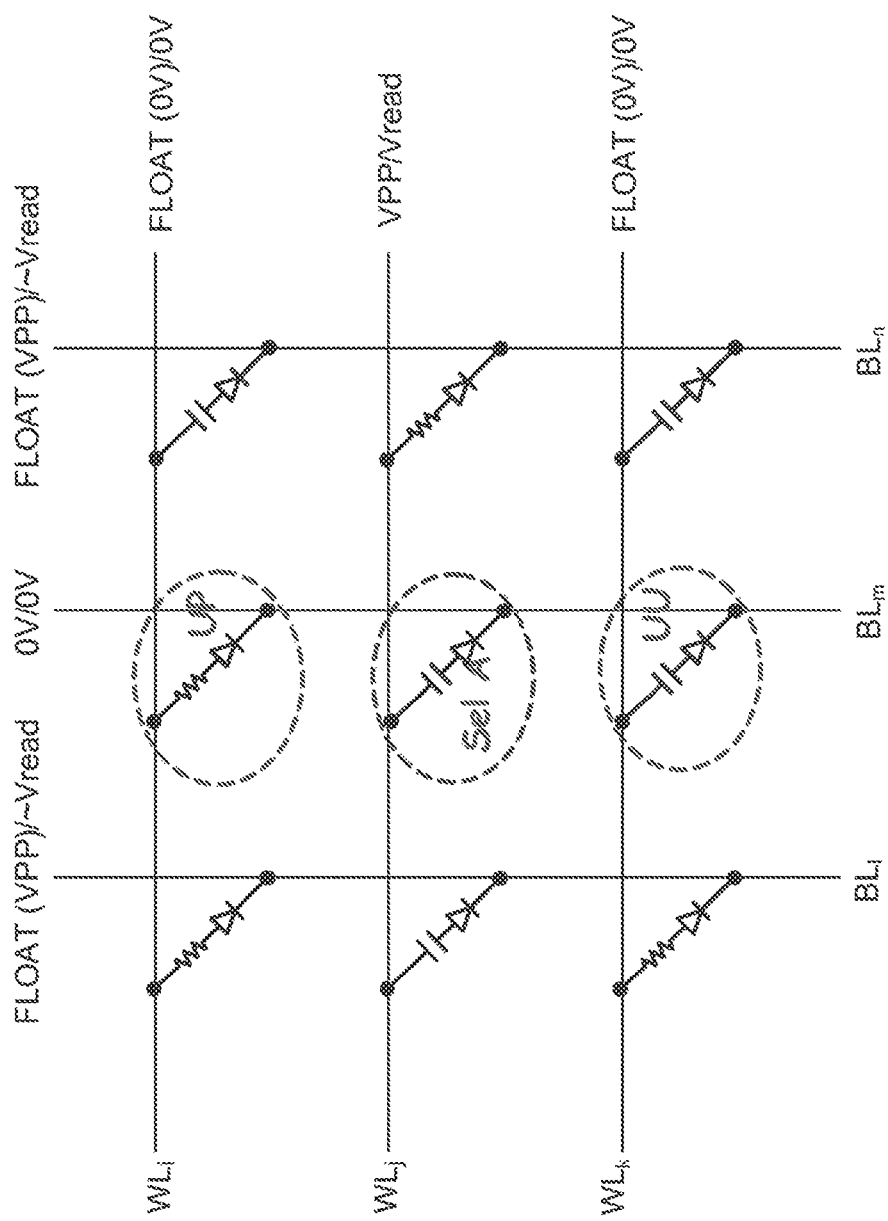
FIG. 23 shows schematically the memory array in accordance with another embodiment.

FIGS. 22A-22B shows a cross-sectional view of a 3×3 cell array along a wordline (FIG. 22A) and a bitline (FIG. 22B). As shown, one of the cells is programmed with a conductive link 2201. In contrast to the cells in FIGS. 21A-21B, a layer of p-type conductivity is added between the gate dielectric and the n-type bitline. Prior to a cell being programmed, it is similar to an n-type enhancement MOS transistor in that it has a n+ source and drain regions and a p-type channel region (see FIG. 22B). When a selected cell is to be programmed by applying program voltage Vpp at the gate and Vbl at the bitline and therefore n+ regions, the channel region of the selected cell is inverted and the gate dielectric breaks down due to the applied high voltage (Vpp-Vbl). Cell array operation is similar to FIG. 17 and the difference is in the presence of p-n diodes prior to programming. This can be seen schematically in FIG. 23. After a cell is programmed, leakage from bitline to wordline is now limited by the reverse-biased leakage of a process diode formed by the doped regions of n-type bitline and the p-type surface layer.

There are at least two simple methods for forming the shallow surface p-region. Firstly, one can implant the special n-type retrograde bitline inside a NMOS p-well such that a surface region remains as p-type. Second, a shallow p-type dopant such as boron or BF2 can be implanted right after the n-type bitline implant. This technique may be used if it is difficult to optimize the existing p-well and n-type bitline doping profile.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

The invention claimed is:

1. A one-time programmable non-volatile memory cell comprising:
    a buried bitline formed in a substrate;
    a dielectric layer formed over at least a portion of the buried bitline, the dielectric layer over the portion of the buried bitline having an even thickness;
    insulating layers formed in the substrate on either side of the buried bitline, the insulating layers having a depth in the substrate greater than that of the buried bitline;
    a conductive gate formed over the dielectric layer and a channel region under the conductive gate and dielectric layer; and
    doped regions on either side of the conductive gate in the buried bitline but displaced from edges of the conductive gate wherein the channel region has no electrical interaction other than to the buried bitline or conductive gate.

2. The memory cell of claim 1 wherein the buried bitline has a severe graded first conductivity dopant concentration with a lower dopant concentration near the dielectric layer and a higher dopant concentration deeper in the substrate.

3. The memory cell of claim 1 wherein the buried bitline has a first conductivity, and the conductive gate has a second conductivity different from the first conductivity.

4. The memory cell of claim 3 wherein the buried bitline has a severe graded first conductivity dopant concentration with a lower dopant concentration near the dielectric layer and a higher dopant concentration deeper in the substrate.

5. The memory cell of claim 1 wherein the buried bitline has a first conductivity and the doped regions are of a second conductivity.

6. The memory cell of claim 1 wherein the buried bitline has a first conductivity and the doped regions are also of the first conductivity.

7. The memory cell of claim 1 wherein the insulating layers comprise shallow trench isolation.

8. The memory cell of claim 1 further comprising sidewall spacers disposed against the gate layer.

9. A one-time programmable non-volatile memory cell comprising:
   a buried bitline formed in a substrate, the buried bitline having a first conductivity;
   a dielectric layer formed over at least a portion of the buried bitline;
   insulating layers formed in the substrate on either side of the buried bitline, the insulating layers having a depth in the substrate greater than that of the buried bitline;
   a conductive gate formed over the dielectric layer and a channel region under the conductive gate and dielectric layer, the conductive gate has a second conductivity different from the first conductivity; and
   doped regions on either side of the conductive gate in the buried bitline but displaced from edges of the conductive gate wherein the channel region has no electrical interaction other than to the buried bitline or conductive gate.

10. The memory cell of claim 9 wherein the dielectric layer over the portion of the buried bitline has an even thickness.

11. The memory cell of claim 9 wherein the buried bitline has a severe graded first conductivity dopant concentration with a lower dopant concentration near the dielectric layer and a higher dopant concentration deeper in the substrate.

12. The memory cell of claim 9 wherein the doped regions are of the second conductivity.

13. The memory cell of claim 9 wherein the doped regions are also of the first conductivity.

14. A one-time programmable non-volatile memory cell comprising:
   a buried bitline formed in a substrate, the buried bitline having a first conductivity and a severe graded first conductivity dopant concentration with a lower dopant concentration near a dielectric layer and a higher dopant concentration deeper in the substrate;
   the dielectric layer formed over at least a portion of the buried bitline;
   insulating layers formed in the substrate on either side of the buried bitline;
   a conductive gate formed over the dielectric layer and a channel region under the conductive gate and dielectric layer, the conductive gate having a second conductivity different from the first conductivity; and
   wherein the channel region has no electrical interaction other than to the buried bitline or conductive gate.

15. The memory cell of claim 14 further comprising:
   doped regions on either side of the conductive gate in the buried bitline but displaced from edges of the conductive gate.

16. The memory cell of claim 15 wherein the buried bitline has the first conductivity and the doped regions are of the second conductivity.

17. The memory cell of claim 15 wherein the buried bitline has the first conductivity and the doped regions are also of the first conductivity.

18. A one-time programmable non-volatile memory cell comprising:
   a buried bitline formed in a substrate, the buried bitline having a first conductivity and a severe graded first conductivity dopant concentration with a lower dopant concentration near a dielectric layer and a higher dopant concentration deeper in the substrate;
   the dielectric layer formed over at least a portion of the buried bitline;
   insulating layers formed in the substrate on either side of the buried bitline, the insulating layers having a depth in the substrate greater than that of the buried bitline;
   a conductive gate formed over the dielectric layer and a channel region under the conductive gate and dielectric layer; and
   wherein the channel region does not have electrical interaction other than to the buried bitline or conductive gate.

19. The method of claim 18 wherein the dielectric layer over the portion of the buried bitline has an even thickness.

20. The memory cell of claim 18 further comprising:
   doped regions on either side of the conductive gate in the buried bitline but displaced from edges of the conductive gate.

21. The memory cell of claim 20 wherein the buried bitline has the first conductivity and the doped regions are of a second conductivity.

22. The memory cell of claim 20 wherein the buried bitline has the first conductivity and the doped regions are also of the first conductivity.

23. A one-time programmable non-volatile memory cell comprising:
   a buried bitline formed in a substrate, the buried bitline having a first conductivity;
   a dielectric layer formed over at least a portion of the buried bitline, the dielectric layer over the portion of the buried bitline having an even thickness;
   insulating layers formed in the substrate on either side of the buried bitline;
   a conductive gate formed over the dielectric layer and a channel region under the conductive gate and dielectric layer, the conductive gate having a second conductivity different from the first conductivity; and
   wherein the channel region does not have electrical interaction other than to the buried bitline or conductive gate.

24. The memory cell of claim 23 further comprising:
   doped regions on either side of the conductive gate in the buried bitline but displaced from edges of the conductive gate.

25. The memory cell of claim 24 wherein the buried bitline has the first conductivity and the doped regions are of the second conductivity.

26. The memory cell of claim 24 wherein the buried bitline has the first conductivity and the doped regions are also of the first conductivity.

27. A one-time programmable non-volatile memory cell comprising:

a buried bitline formed in a substrate, the buried bitline having a first conductivity and a severe graded first conductivity dopant concentration with a lower dopant concentration near a dielectric layer and a higher dopant concentration deeper in the substrate;

the dielectric layer formed over at least a portion of the buried bitline, the dielectric layer over the portion of the buried bitline having an even thickness;

insulating layers formed in the substrate on either side of the buried bitline;

a conductive gate formed over the dielectric layer and a channel region under the conductive gate and dielectric layer; and wherein the channel region does not have electrical interaction other than to the buried bitline or conductive gate.

28. The memory cell of claim 27 further comprising:
doped regions on either side of the conductive gate in the buried bitline but displaced from edges of the conductive gate.

29. The memory cell of claim 28 wherein the buried bitline has the first conductivity and the doped regions are of a second conductivity.

30. The memory cell of claim 28 wherein the buried bitline has the first conductivity and the doped regions are also of the first conductivity.

* * * * *